US012598950B2

(12) United States Patent
Hara

(10) Patent No.: US 12,598,950 B2
(45) Date of Patent: Apr. 7, 2026

(54) ELECTROSTATIC CHUCK HEATER AND FILM DEPOSITION APPARATUS

(71) Applicant: NGK INSULATORS, LTD., Nagoya-City (JP)

(72) Inventor: Tomohiro Hara, Handa-City (JP)

(73) Assignee: NGK INSULATORS, LTD., Nagoya (JP)

( * ) Notice: Subject to any disclaimer, the term of this patent is extended or adjusted under 35 U.S.C. 154(b) by 384 days.

(21) Appl. No.: 18/316,274

(22) Filed: May 12, 2023

(65) Prior Publication Data

US 2024/0203779 A1     Jun. 20, 2024

Related U.S. Application Data

(63) Continuation of application No. PCT/JP2022/046273, filed on Dec. 15, 2022.

(51) Int. Cl.
H01L 21/683 (2006.01)
G03F 7/00 (2006.01)
(Continued)

(52) U.S. Cl.
CPC .......... H01L 21/6833 (2013.01); G03F 7/707 (2013.01); H01J 37/32724 (2013.01);
(Continued)

(58) Field of Classification Search
None
See application file for complete search history.

(56) References Cited

U.S. PATENT DOCUMENTS

2002/0067585 A1* 6/2002 Fujiwara ............. H01L 21/6838
                                                            361/234
2004/0188413 A1* 9/2004 Natsuhara ......... H01L 21/67109
                                                            219/466.1
(Continued)

FOREIGN PATENT DOCUMENTS

JP        2002-009139 A     1/2002
JP        2004-282047 A    10/2004
(Continued)

OTHER PUBLICATIONS

English translation of the International Search Report dated Jan. 21, 2023 (Application No. PCT/JP2022/046273).
(Continued)

*Primary Examiner* — Feifei Yeung Lopez
(74) *Attorney, Agent, or Firm* — BURR PATENT LAW, PLLC

(57)               ABSTRACT

There is provided an electrostatic chuck heater including: a ceramic plate having a first surface for bearing a wafer on which a film is to be deposited, and a second surface opposite the first surface, and including ESC electrodes and a heater electrode which are built therein; a ceramic shaft which is attached to the second surface of the ceramic plate and which comprises an internal space for accommodating an ESC rod connected to the ESC electrodes and a heater rod connected to the heater electrode; a plurality of lift pin holes penetrating the ceramic plate from the first surface to the second surface; and a plurality of protrusions arranged on the first surface of the ceramic plate with equal spacing from each other and with rotational symmetry about a central axis of each of the lift pin holes.

13 Claims, 3 Drawing Sheets

(51) Int. Cl.
   *H01J 37/32*      (2006.01)
   *H01L 21/687*     (2006.01)
   *H05B 3/14*      (2006.01)

(52) U.S. Cl.
   CPC .. *H01L 21/68742* (2013.01); *H01L 21/68792*
           (2013.01); *H05B 3/143* (2013.01)

(56) References Cited

U.S. PATENT DOCUMENTS

| | | | |
|---|---|---|---|
| 2005/0041364 A1* | 2/2005 | Kellerman | H01L 21/6875 |
| | | | 361/234 |
| 2005/0274324 A1* | 12/2005 | Takahashi | H01L 21/6831 |
| | | | 118/723 E |
| 2009/0284894 A1* | 11/2009 | Cooke | H02N 13/00 |
| | | | 438/700 |
| 2012/0044609 A1 | 2/2012 | Cooke et al. | |
| 2013/0014896 A1 | 1/2013 | Shoji et al. | |
| 2015/0348813 A1 | 12/2015 | Mangalore et al. | |
| 2016/0111315 A1* | 4/2016 | Parkhe | H01L 21/68785 |
| | | | 361/234 |
| 2018/0301368 A1 | 10/2018 | Nonaka et al. | |

| | | | |
|---|---|---|---|
| 2020/0126773 A1 | 4/2020 | Unno et al. | |
| 2020/0312696 A1 | 10/2020 | Unno et al. | |
| 2020/0373187 A1 | 11/2020 | Singu et al. | |

FOREIGN PATENT DOCUMENTS

| | | |
|---|---|---|
| JP | 2012-527125 A | 11/2012 |
| JP | 2020-191450 A | 11/2020 |
| JP | 6792455 B2 | 11/2020 |
| JP | 6818351 B2 | 1/2021 |
| JP | 6948458 B2 | 10/2021 |
| KR | 10-2019-0042523 A | 4/2019 |
| WO | 2019/187785 A1 | 10/2019 |
| WO | 2019/188681 A1 | 10/2019 |

OTHER PUBLICATIONS

English translation of the Written Opinion of the International Searching Authority dated Jan. 31, 2023 (Application No. PCT/JP2022/046273).

Korean Office Action (Application No. 10-2023-7021274) dated Sep. 12, 2024 (with English translation) (13 pages).

International Search Report and Written Opinion dated Jan. 31, 2023 (Application No. PCT/JP2022/046273).

* cited by examiner

ELECTROSTATIC CHUCK HEATER AND FILM DEPOSITION APPARATUS

CROSS-REFERENCE TO RELATED APPLICATION

This application is a continuation application of PCT/JP2022/046273 filed Dec. 15, 2022, the entire contents of which are incorporated herein by reference.

BACKGROUND OF THE INVENTION

1. Field of the Invention

The present invention relates to an electrostatic chuck heater and a film deposition apparatus.

2. Description of the Related Art

In a film deposition apparatus for semiconductor manufacturing processes, a ceramic heater is used as a support stage for uniformly controlling the wafer temperature. A ceramic heater comprising an electrostatic chuck to enable stable wafer chucking is also known.

Patent Literature 1 (JP6948458B) discloses an electrostatic chuck heater of the Johnsen-Rahbek type, which is used to form a conducting film on a wafer. This electrostatic chuck heater comprises: a disc-shaped ceramic base having electrostatic electrodes and resistive heating elements; and a hollow shaft attached to the ceramic base. The surface of the ceramic substrate is embossed with a plurality of protrusions and raised portions that can contact the wafer in predetermined areas, and these protrusions and raised portions (hereinafter collectively referred to as protrusions) are said to enable stable chucking of the wafer.

Various other susceptors having a surface embossed with a plurality of protrusions are known (see Patent Literature 2 (JP6792455B, in particular, FIG. 3A), Patent Literature 3 (JP2020-191450A, in particular, FIG. 3), and Patent Literature 4 (JP6818351B, in particular, FIG. 7), for example). As disclosed in these documents, the plurality of protrusions embossed on the surface of a conventional susceptor are generally arranged with equal spacing and with symmetry about the central axis of the wafer to be placed on the susceptor.

CITATION LIST

Patent Literature

Patent Literature 1: JP6948458B
Patent Literature 2: JP6792455B
Patent Literature 3: JP2020-191450A
Patent Literature 4: JP6818351B

SUMMARY OF THE INVENTION

As described above, by arranging a plurality of embossed protrusions with equal spacing on the surface of the susceptor, stable wafer chucking in each area is possible, which contributes to the deposition of a film of uniform thickness on the wafer. Moreover, the contact area between the susceptor surface and the wafer can be reduced by the interposition of the protrusions, and as a result, contamination caused by contact with the susceptor can be reduced, and the adsorption force attracting the wafer to the susceptor can be optimized to facilitate removal of the wafer.

However, as disclosed in Patent Literatures 2 to 4, the plate portion of the susceptor on which the wafer will be placed may have lift pin holes in addition to embossed protrusions. Lift pin holes are holes used to insert lift pins for lifting the wafer from below after deposition or other processing, and multiple (for example, three or four) lift pin holes are located at a distance from each other. In this case, as illustrated in FIGS. 5 and 6, in a conventional layout in which protrusions 118 on the surface of a plate 112 are arranged with equal spacing and with symmetry about the central axis $C_P$ of the plate 112, the plurality of protrusions 118 surrounding a lift pin hole 116 cannot be arranged with rotational symmetry about the central axis $C_H$ of the lift pin hole 116. Moreover, the protrusions 118 cannot be provided at locations that overlap the lift pin hole 116, and as a result, the protrusions 118 must be omitted at such locations. For example, in the portion A enclosed by the chain line in FIG. 5, the protrusion 118 that should have been provided according to the regular arrangement overlaps with the lift pin hole 116, and therefore is omitted. The result is that, as illustrated in FIGS. 5 and 6, the plurality of protrusions 118 around the lift pin hole 116 are arranged asymmetrically or non-uniformly with respect to the lift pin hole 116, leading to unstable electrostatic adsorption and increased warpage of the wafer W, which is strongly electrostatically adsorbed to the plate 112 but supported only by the protrusions 118. In this case, since the wafer W does not warp concentrically with respect to the lift pin hole 116, the warpage is non-uniform. Non-uniform warpage of the wafer W may result in the deposition of a film of non-uniform thickness on the wafer W.

The inventors have currently found that by arranging the plurality of protrusions on the ceramic plate with equal spacing from each other and with rotational symmetry about the central axis of each of the lift pin holes, it is possible to provide an electrostatic chuck heater that can equalize the warpage of the wafer around the lift pin holes.

Consequently, an objective of the present invention is to provide an electrostatic chuck heater capable of equalizing the warpage of the wafer around the lift pin holes.

The present invention provides the following aspects:

[Aspect 1]

An electrostatic chuck heater to be used in a film deposition apparatus, the electrostatic chuck heater comprising:

a ceramic plate having a first surface for bearing a wafer on which a film is to be deposited, and a second surface opposite the first surface, and comprising ESC electrodes and a heater electrode which are built therein;

a ceramic shaft which is attached to the second surface of the ceramic plate and which comprises an internal space for accommodating an ESC rod connected to the ESC electrodes and a heater rod connected to the heater electrode;

a plurality of lift pin holes penetrating the ceramic plate from the first surface to the second surface; and a plurality of protrusions arranged on the first surface of the ceramic plate with equal spacing from each other and with rotational symmetry about a central axis of each of the lift pin holes.

[Aspect 2]

The electrostatic chuck heater according to Aspect 1, wherein the plurality of protrusions are arranged asymmetrically about a central axis of the ceramic plate.

[Aspect 3]

The electrostatic chuck heater according to Aspect 1 or 2, wherein the plurality of protrusions are arranged according to a regular pattern with one selected from the group consisting of a circle, a square, an equilateral triangle, and a regular hexagon as a constituent unit.

[Aspect 4]

The electrostatic chuck heater according to Aspect 3, wherein a circumscribed circle of the constituent unit of the regular pattern has a diameter of 4 mm to 30 mm.

[Aspect 5]

The electrostatic chuck heater according to Aspect 3 or 4, wherein the constituent unit of the regular pattern is an equilateral triangle.

[Aspect 6]

The electrostatic chuck heater according to Aspect 5, wherein one side of the equilateral triangle is 4 mm to 30 mm.

[Aspect 7]

The electrostatic chuck heater according to Aspect 5 or 6, wherein the plurality of protrusions are arranged to have 3-fold rotational symmetry or 6-fold rotational symmetry about the central axis of each of the lift pin holes.

[Aspect 8]

The electrostatic chuck heater according to any one of Aspects 1 to 7, wherein the distance between central axes of adjacent protrusions is 4 mm to 30 mm.

[Aspect 9]

The electrostatic chuck heater according to any one of Aspects 1 to 8, wherein the protrusions have a height of 0.001 mm to 0.1 mm.

[Aspect 10]

The electrostatic chuck heater according to any one of Aspects 1 to 9, wherein the lift pin holes have a circular shape in a plan view.

[Aspect 11]

The electrostatic chuck heater according to any one of Aspects 1 to 10, wherein the lift pin holes are three or four in number.

[Aspect 12]

The electrostatic chuck heater according to any one of Aspects 1 to 11, wherein the lift pin holes have a diameter of 1 mm to 5 mm.

[Aspect 13]

The electrostatic chuck heater according to any one of Aspects 1 to 12, further comprising the ESC rod and the heater rod in the inner space of the ceramic shaft.

[Aspect 14]

A film deposition apparatus comprising a deposition chamber and the electrostatic chuck heater according to any one of Aspects 1 to 13 located inside the deposition chamber.

DETAILED DESCRIPTION OF THE INVENTION

An electrostatic chuck heater according to the present invention is used in a film deposition apparatus, particularly a film deposition apparatus for semiconductor manufacturing processes. The electrostatic chuck heater functions as a susceptor in the film deposition apparatus, whereby a wafer on which a film is to be deposited is chucked by electrostatic adsorption while being heated. Typical examples of film deposition apparatuses to which the electrostatic chuck heater can be applied include a chemical vapor deposition (CVD) apparatus (for example, thermal CVD apparatus, plasma CVD apparatus, optical CVD apparatus, and MOCVD apparatus) and a physical vapor deposition (PVD) apparatus.

Figure 1:
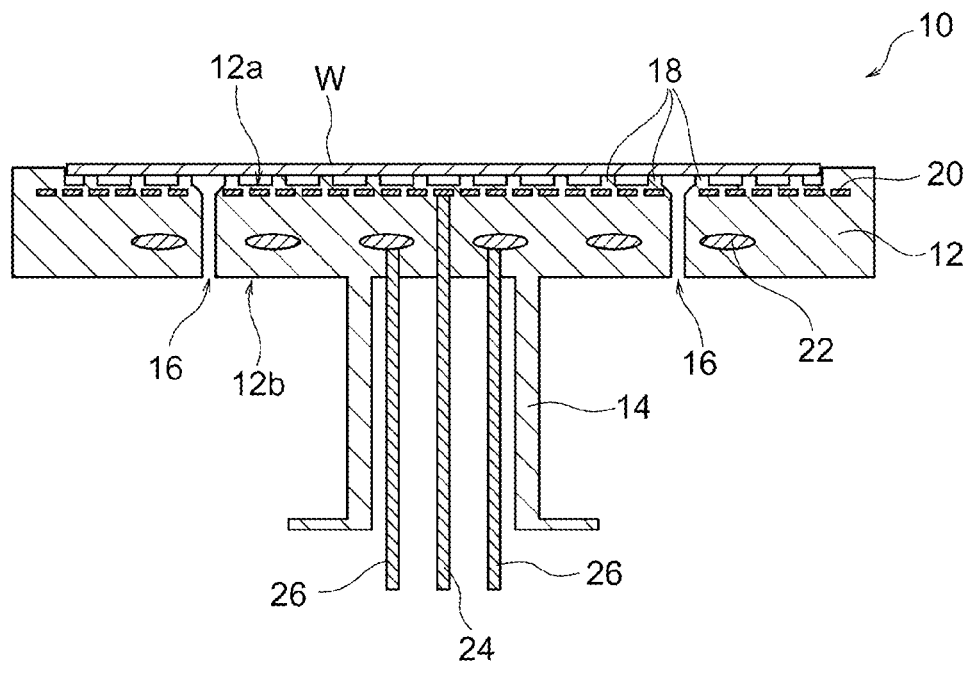
FIG. 1 is a schematic cross section illustrating an example of an electrostatic chuck heater according to the present invention.
Figure 2:
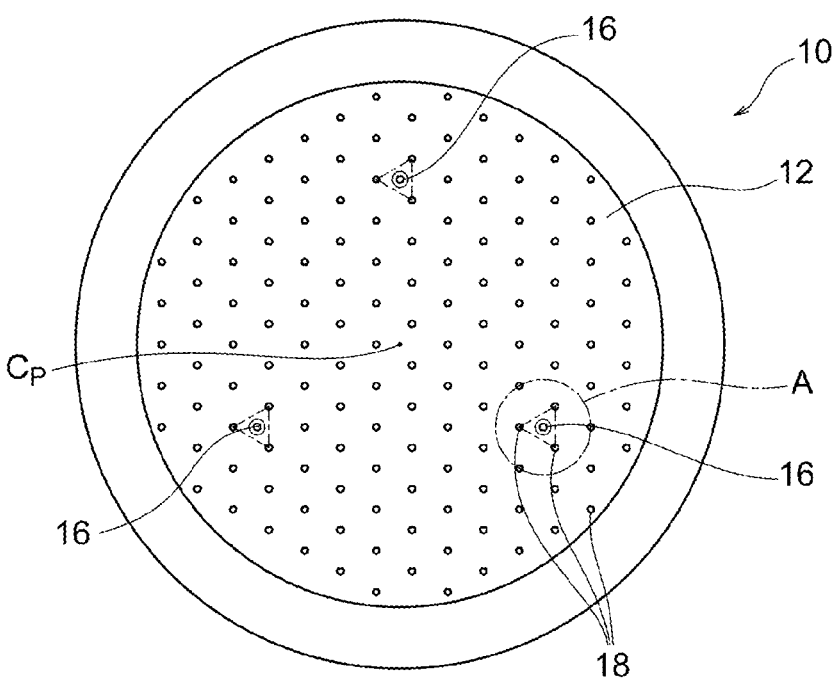
FIG. 2 is a schematic top view illustrating an example of an electrostatic chuck heater according to the present invention.

FIGS. 1 and 2 illustrate an example of an electrostatic chuck heater. The electrostatic chuck heater 10 illustrated in FIGS. 1 and 2 comprises a ceramic plate 12, a ceramic shaft 14, a plurality of lift pin holes 16, and a plurality of protrusions 18. ESC electrodes 20 and a heater electrode 22 are built in the ceramic plate 12. The ceramic plate 12 has a first surface 12a for bearing a wafer W on which a film is to be deposited and a second surface 12b opposite the first surface 12a, the ceramic shaft 14 being attached to the second surface 12b. The ceramic shaft 14 comprises an internal space for accommodating an ESC rod 24 connected to the ESC electrodes 20 and heater rods 26 connected to the heater electrode 22. The lift pin holes 16 are provided so as to penetrate the ceramic plate 12 from the first surface 12a to the second surface 12b. The protrusions 18 are arranged on the first surface 12a of the ceramic plate 12 with equal spacing from each other and with rotational symmetry about the central axis $C_H$ of each of the lift pin holes 16. In this way, by arranging the plurality of protrusions 18 on the ceramic plate 12 with equal spacing from each other and with rotational symmetry about the central axis $C_H$ of each of the lift pin holes 16, the warpage of the wafer W around the lift pin holes 16 can be equalized.

Figure 3:
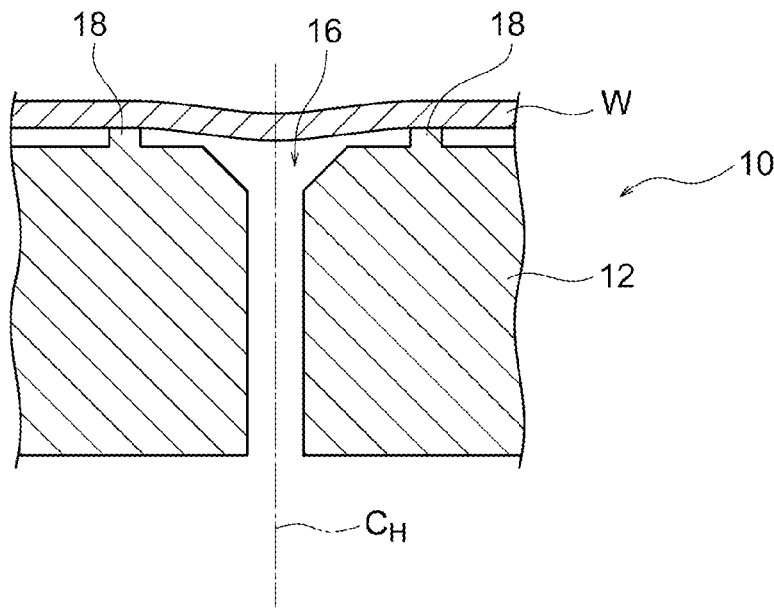
FIG. 3 is a schematic cross section conceptually illustrating a cross section in the vicinity of a lift pin hole of the electrostatic chuck heater illustrated in FIG. 2.
Figure 5:
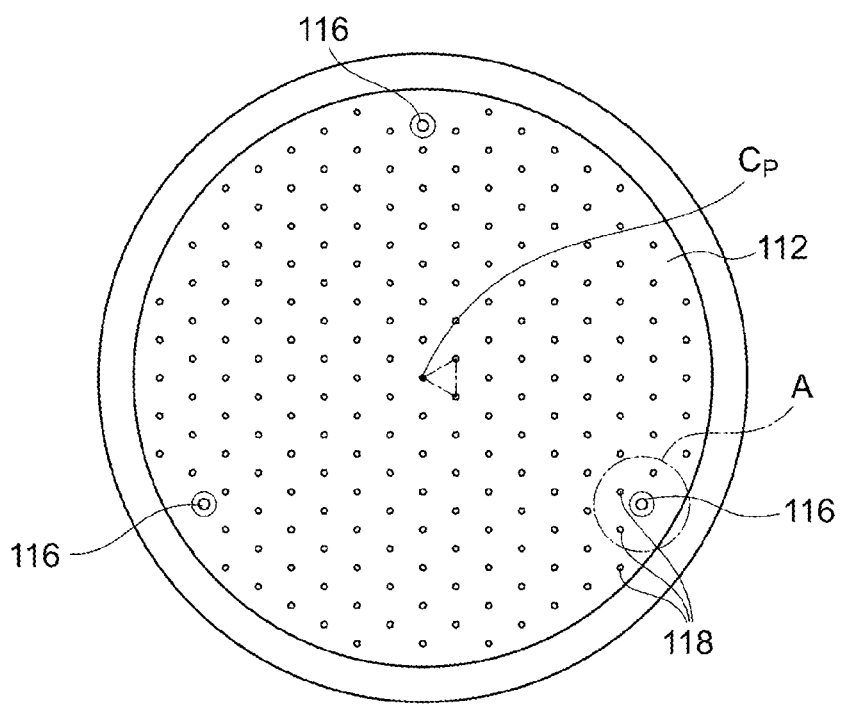
FIG. 5 is a schematic top view illustrating an example of an electrostatic chuck heater according to the related art.
Figure 6:
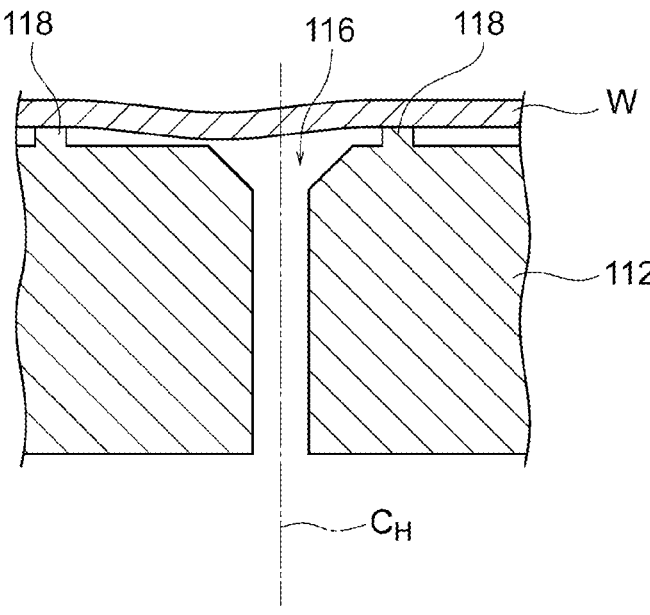
FIG. 6 is a schematic cross section conceptually illustrating a cross section in the vicinity of a lift pin hole of the electrostatic chuck heater according to the related art illustrated in FIG. 5.

That is, as described above, in a conventional susceptor, the protrusions 118 on the surface of the plate 112 are generally arranged with equal spacing and with symmetry about the central axis $C_P$ of the plate 112, as illustrated in FIGS. 5 and 6. In this case, the plurality of protrusions 118 around the lift pin hole 116 are arranged asymmetrically or non-uniformly with respect to the lift pin hole 116, leading to unstable electrostatic adsorption and increased warpage of the wafer W, which is strongly electrostatically adsorbed to the plate 112 but supported only by the protrusions 118. In particular, since the wafer W does not warp concentrically about the central axis $C_H$ of the lift pin hole 116, the warpage is non-uniform and may result in the deposition of a film of non-uniform thickness on the wafer W. According to the electrostatic chuck heater 10 of the present invention, this problem is resolved or lessened. This is because by arranging the plurality of protrusions 18 with equal spacing from each other and with rotational symmetry about the central axis $C_H$ of each of the lift pin holes 16 as illustrated in FIGS. 2 and 3, the warpage of the wafer W around the lift pin holes 16 is equalized. That is, the central axis $C_H$ of each lift pin hole 16 is configured to be located at the center of a polygon (an equilateral triangle in FIG. 2) connecting the plurality of protrusions 18 closest to the lift pin hole 16, and therefore the warpage of the wafer W is distributed concentrically from the central axis $C_H$ of the lift pin hole 16, resulting in uniform warpage in the circumferential direction of a concentric circle. Furthermore, since warpage of the wafer W affects the film thickness when depositing a film on the wafer W, by making the warpage of the wafer W around the lift pin holes 16 uniform, a uniform film thickness can be achieved. That is, by using the electrostatic chuck heater 10 according to the present invention in a film deposition apparatus, uniformity of thickness can be improved for a film deposited on the wafer W.

The following are considered to be reasons why uniform film thickness can be achieved by making the warpage of the wafer W around the lift pin holes 16 uniform. First, the lift pin holes 16 are presupposed to be areas free of the heater electrode 22. Consequently, the wafer temperature over the lift pin holes 16 is lower than the wafer temperature in other areas, and as a result, singularities easily occur in the film thickness during deposition in the areas where the wafer temperature is lower (that is, the film thickness around the lift pin holes 16 tends to vary specifically in contrast with the stable film thickness in areas distant from the lift pin holes 16). Also, it is assumed that the shorter the distance between the wafer W and the ceramic plate 12, the greater the heat conduction from ceramic plate 12 and the higher the temperature of the wafer W. In this regard, if the protrusions 18 are arranged with rotational asymmetry about the lift pin holes 16 around the lift pin holes 16 where singularities easily occur as described above, the distance between the wafer W and the ceramic plate 12 is not rotationally symmetrical due to warpage and the wafer temperature becomes more uneven, thereby broadening the area of the singularities, resulting in further lowering of the uniformity of the film thickness. If chips are mounted onto the wafer W in which the uniformity of film thickness is lowered in this way, yield may be lowered. In this respect, it is thought that the lift pin holes 16 and surrounding areas, which have poor film thickness distribution to begin with, are further aggravated by the unequal arrangement of the protrusions 18, leading to lower yield. According to the present invention, such defects are eliminated or reduced as described above.

Other than the arrangement of the protrusions 18 on the first surface 12a, the ceramic plate 12 is not particularly limited and may have a configuration similar to a ceramic plate adopted in a known electrostatic chuck heater. The major portion (namely, the ceramic base) of the ceramic plate 12 other than the ESC electrodes 20 and the heater electrode 22 preferably is composed of aluminum nitride from the standpoint of, among other things, excellent thermal conductivity, high electrical insulation, and thermal expansion characteristics similar to silicon. A preferable shape of the ceramic plate 12 is a disc shape. However, the plan view shape of the disc-shaped ceramic plate 12 does not have to be completely circular, and may also be an incomplete circle with a portion missing, like with orientation flat (OF), for example. The size of the ceramic plate 12 is not particularly limited and may simply be determined appropriately according to the diameter of the wafer W that is expected to be used, but in the case of a circular shape, the diameter is typically 150 mm to 450 mm, such as approximately 300 mm, for example.

The ESC electrodes 20 and heater electrode 22 are built into or embedded in the ceramic plate 12. The ESC electrodes 20 are an abbreviation of electrostatic chuck (ESC) electrodes, and are also referred to as electrostatic electrodes. The ESC electrodes 20 are preferably circular thinlayer electrodes with a slightly smaller diameter than the ceramic plate 12, and may be mesh electrodes made of fine metal wires woven into a mesh-like sheet, for example. The ESC electrodes 20 may also be used as plasma electrodes. That is, by applying high frequencies to the ESC electrodes 20, the ESC electrodes 20 can also be used as plasma electrodes and films can be deposited by the plasma CVD process. The ESC rod 24 for supplying electric power is connected to the ESC electrodes 20, and the ESC rod 24 is connected to an external power source (not illustrated) through the internal space of the ceramic shaft 14. When a voltage is applied by the external power source, the ESC electrodes 20 chuck the wafer W placed on the first surface 12a. The chucking force at this time is the Johnsen-Rahbek force because the aluminum nitride forming the major portion of the ceramic plate 12 has a volume resistivity from $1 \times 10^8$ Ωcm to $1 \times 10^{13}$ Ωcm. The heater electrode 22 is not particularly limited and may be, for example, a conductive coil obtained by winding a single wire throughout the entire surface of the ceramic plate 12. The heater rods 26 for supplying electric power are connected to both ends of the heater electrode 22, and the heater rods 26 are connected to a heater power source (not illustrated) through the internal space of the ceramic shaft 14. When electric power is supplied from the heater power source, the heater electrode 22 heats up and heats the wafer W placed on the first surface 12a. The heater electrode 22 is not limited to a coil and may also be ribbons (long thin sheets) or a mesh, for example.

The lift pin holes 16 are provided penetrating the ceramic plate 12 from the first surface 12a to the second surface 12b. As described above, the lift pin holes 16 are holes used to insert lift pins (not illustrated) for lifting the wafer W from below after deposition. That is, after deposition, the lift pins are passed through the lift pin holes 16 to stick out from the first surface 12a of the ceramic plate 12 and lift up the wafer W, thereby allowing for easy removal of the wafer W from the electrostatic chuck heater 10.

The plan view shape of the lift pin holes 16 may be any shape, such as circular or polygonal, but preferably circular. The lift pin holes 16 provided in the ceramic plate 12 are preferably three or four in number, more preferably three. By having a small number of holes in this way, it is possible to secure a large effective area on the ceramic plate 12 while also ensuring enough fulcrums for lifting the wafer W with the lift pins (not illustrated). The diameter of the lift pin holes 16 is not particularly limited, but is preferably 1 mm to 5 mm, more preferably 2 mm to 4 mm, even more preferably 2 mm to 3 mm.

The protrusions 18 are for contacting the bottom surface of the wafer W and supporting the wafer W, and are arranged on the first surface 12a of the ceramic plate 12 with equal spacing from each other and with rotational symmetry about the central axis $C_H$ of each of the lift pin holes 16. Therefore, unlike the layout typically adopted in the technology of the related art (see FIG. 5, for example), the protrusions 18 may be arranged asymmetrically about the central axis $C_P$ of the ceramic plate 12. The shape of the individual protrusions 18 is not particularly limited, but is preferably cylindrical. The diameter of the individual protrusions 18 is not particularly limited, but is preferably 0.1 mm to 8 mm, more preferably 0.5 mm to 5 mm, even more preferably 0.5 mm to 4 mm, especially preferably 0.70 mm to 2.54 mm. The protrusions 18 preferably are formed as one with the ceramic plate 12 by an embossing or other process. Consequently, the protrusions 18 also are preferably composed of aluminum nitride, similarly to the ceramic plate 12. The height of the protrusions 18 is not particularly limited, but is preferably 0.001 mm to 0.1 mm, more preferably 0.005 mm to 0.08 mm, even more preferably 0.01 mm to 0.05 mm, especially preferably 0.01 mm to 0.03 mm. The distance between the central axes of adjacent protrusions 18 is preferably 4 mm to 30 mm, more preferably 5 mm to 26 mm, even more preferably 7 mm to 26 mm, especially preferably 7 mm to 15 mm.

Figure 4:
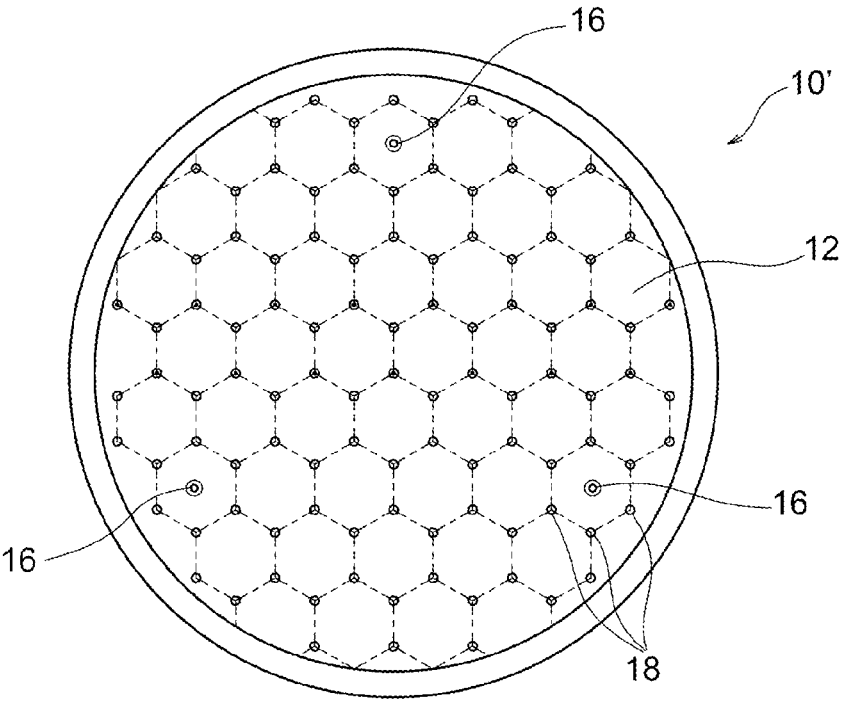
FIG. 4 is a schematic top view illustrating another example of an electrostatic chuck heater according to the present invention.

The plurality of protrusions 18 preferably are arranged according to a regular pattern (or so as to form such a regular pattern) with one selected from the group consisting of a circle, a square, an equilateral triangle, and a regular hexagon as a constituent unit. That is, the plurality of protrusions 18 preferably are arranged so that the centers are located on virtual lines (for example, at the vertices in the case of a polygonal shape) that form a regular pattern comprising a repeating plurality of the above constituent unit. In other words, a virtual figure drawn by connecting the centers of adjacent protrusions 18 preferably forms a regular pattern in which one selected from the group consisting of a circle, a square, an equilateral triangle, and a regular hexagon serves as the constituent unit. For example, in the electrostatic chuck heater 10 illustrated in FIG. 2, the virtual figure drawn by connecting the centers of adjacent protrusions 18 is an equilateral triangle. In the electrostatic chuck heater 10' illustrated in FIG. 4, the virtual figure drawn by connecting the centers of adjacent protrusions 18 is a regular hexagon. In particular, in terms of the ease of arranging the protrusions 18 with equal spacing from each other across the entire first surface 12a, the constituent unit of the regular pattern is more preferably a square, an equilateral triangle, or a regular hexagon, even more preferably an equilateral triangle or a regular hexagon, especially preferably an equilateral triangle. In this sense, it can be said that the protrusions 18 preferably are arranged to have 3-fold rotational symmetry as illustrated in FIG. 2, or 6-fold rotational symmetry as in the electrostatic chuck heater 10' illustrated in FIG. 4, about the central axis $C_H$ of each of the lift pin holes 16. The size of the constituent unit of the regular pattern is not particularly limited, but the circumscribed circle of the constituent unit has a diameter that is preferably 4 mm to 30 mm, more preferably 5 mm to 26 mm, even more preferably 7 mm to 26 mm, especially preferably 7 mm to 15 mm. In the case in which the constituent unit of the regular pattern is an equilateral triangle, one side of the equilateral triangle is preferably 4 mm to 30 mm, more preferably 5 mm to 26 mm, even more preferably 7 mm to 26 mm, especially preferably 7 mm to 15 mm.

The ceramic shaft 14 is a hollow shaft attached to the second surface 12b of the ceramic plate 12, and may have a configuration similar to a ceramic shaft adopted in a known electrostatic chuck heater or ceramic heater. The ceramic shaft 14 includes an internal space for accommodating the ESC rod 24 and the heater rods 26. The ceramic shaft 14 preferably is composed of a ceramic material similar to the ceramic plate 12. Consequently, the ceramic shaft 14 preferably is composed of aluminum nitride. The upper edge of the ceramic shaft 14 preferably is bonded to the second surface 12b of the ceramic plate 12 by solid-state bonding or diffusion bonding. The outer diameter of the ceramic shaft 14 is not particularly limited, but is approximately 40 mm, for example. The inner diameter of the ceramic shaft 14 (the diameter of the inner space) is not particularly limited, but is approximately 36 mm, for example.

The electrostatic chuck heater 10 may further comprise the ESC rod 24 and the heater rods 26 in the inner space of the ceramic shaft 14. One end of the ESC rod 24 is connected to the ESC electrodes 20, and the other end is connected to the external power source (not illustrated).

Similarly, one end of the heater rods 26 is connected to the heater electrode 22, and the other end is connected to the heater power source (not illustrated). With this configuration, electric power supply paths to the ESC electrodes 20 and the heater electrode 22 are secured.

As described above, the electrostatic chuck heater according to the present invention is used in a film deposition apparatus, particularly a film deposition apparatus for semiconductor manufacturing processes. Therefore, according to another aspect of the present invention, there is provided a film deposition apparatus comprising a deposition chamber (not illustrated) and the electrostatic chuck heater 10 set up inside the deposition chamber. As described above, examples of such a film deposition apparatus include a chemical vapor deposition (CVD) apparatus (for example, thermal CVD apparatus, plasma CVD apparatus, optical CVD apparatus, and MOCVD apparatus) and a physical vapor deposition (PVD) apparatus.

A method of using the electrostatic chuck heater 10 in the film deposition apparatus is as follows. The electrostatic chuck heater 10 is disposed inside the chamber of the film deposition apparatus, and the wafer W is placed on the protrusions 18 of the ceramic plate 12. Thereafter, a voltage is applied to the ESC electrodes 20, thereby chucking the wafer W with the Johnsen-Rahbek force. Additionally, the temperature of the ceramic plate 12 is calculated on the basis of a detection signal from a thermocouple (not illustrated), and the voltage and current applied to the heater electrode 22 are controlled so that the temperature is a target temperature. In such a state, a film may simply be deposited on the upper surface of the wafer W by CVD or the like. After deposition, the lift pins (not illustrated) are passed through the lift pin holes 16 to stick out from the first surface 12a of the ceramic plate 12 and lift up the wafer W, thereby assisting with the removal of the wafer W from the electrostatic chuck heater 10.

What is claimed is:

1. An electrostatic chuck heater comprising:
   a ceramic plate having a first surface for bearing a wafer, and a second surface opposite the first surface, and comprising ESC electrodes and a heater electrode which are built therein;
   a ceramic shaft which is attached to the second surface of the ceramic plate and which comprises an internal space for accommodating an ESC rod connected to the ESC electrodes and a heater rod connected to the heater electrode;
   a plurality of lift pin holes penetrating the ceramic plate from the first surface to the second surface; and
   a plurality of protrusions arranged on the first surface of the ceramic plate with equal spacing from each other and with rotational symmetry about a central axis of each of the lift pin holes; and
   wherein the plurality of protrusions are arranged according to a regular pattern with one selected from the group consisting of a circle, an equilateral triangle, and a regular hexagon as a constituent unit.

2. The electrostatic chuck heater according to claim 1, wherein the plurality of protrusions are arranged asymmetrically about a central axis of the ceramic plate.

3. The electrostatic chuck heater according to claim 1, wherein a circumscribed circle of the constituent unit of the regular pattern has a diameter of 4 mm to 30 mm.

4. The electrostatic chuck heater according to claim 1, wherein the constituent unit of the regular pattern is an equilateral triangle.

5. The electrostatic chuck heater according to claim 4, wherein one side of the equilateral triangle is 4 mm to 30 mm.

6. The electrostatic chuck heater according to claim 4, wherein the plurality of protrusions are arranged to have 3-fold rotational symmetry or 6-fold rotational symmetry about the central axis of each of the lift pin holes.

7. The electrostatic chuck heater according to claim 1, wherein the distance between central axes of adjacent protrusions is 4 mm to 30 mm.

8. The electrostatic chuck heater according to claim 1, wherein the protrusions have a height of 0.001 mm to 0.1 mm.

9. The electrostatic chuck heater according to claim 1, wherein the lift pin holes have a circular shape in a plan view.

10. The electrostatic chuck heater according to claim 1, wherein the lift pin holes are three or four in number.

11. The electrostatic chuck heater according to claim 1, wherein the lift pin holes have a diameter of 1 mm to 5 mm.

12. The electrostatic chuck heater according to claim 1, further comprising the ESC rod and the heater rod in the inner space of the ceramic shaft.

13. A film deposition apparatus comprising a deposition chamber and the electrostatic chuck heater according to claim 1 located inside the deposition chamber.

\* \* \* \* \*